(12) United States Patent
Siemieniec et al.

(10) Patent No.: US 8,587,059 B2
(45) Date of Patent: Nov. 19, 2013

(54) TRANSISTOR ARRANGEMENT WITH A MOSFET

(75) Inventors: Ralf Siemieniec, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 103 days.

(21) Appl. No.: 13/092,546

(22) Filed: Apr. 22, 2011

(65) Prior Publication Data
US 2012/0267704 A1 Oct. 25, 2012

(51) Int. Cl.
*H01L 29/66* (2006.01)

(52) U.S. Cl.
USPC .......... 257/341; 257/192; 257/241; 257/272; 257/263; 257/E27.001

(58) Field of Classification Search
USPC ......... 257/263, 265, 266, 272, 330, 331, 334, 257/341, 348, E29.265, 44, 107, 121, 257/133–135, 192, 195, 202, 205, 213, 241, 257/256, 260, 262, 329, 31, 350, 365, 372, 257/499, 504, E27.001, E27.014, E27.095
See application file for complete search history.

(56) References Cited

U.S. PATENT DOCUMENTS

| | | | | |
|---|---|---|---|---|
| 5,072,266 A | * | 12/1991 | Bulucea et al. | 257/330 |
| 6,313,482 B1 | * | 11/2001 | Baliga | 257/77 |
| 6,600,193 B2 | * | 7/2003 | Darwish | 257/330 |
| 6,998,678 B2 | * | 2/2006 | Werner et al. | 257/334 |
| 7,446,374 B2 | * | 11/2008 | Thorup et al. | 257/330 |
| 2008/0265289 A1 | * | 10/2008 | Bhalla et al. | 257/263 |
| 2010/0044720 A1 | | 2/2010 | Siemieniec et al. | |
| 2011/0248286 A1 | * | 10/2011 | Onose | 257/77 |

FOREIGN PATENT DOCUMENTS

| | | |
|---|---|---|
| DE | 112005002418 T5 | 9/2007 |
| DE | 102009047808 A1 | 5/2011 |
| WO | 2006042040 A2 | 4/2006 |

OTHER PUBLICATIONS

Calafut, D., "Trench Power MOSFET Lowside Switch with Optimized Integrated Schottky Diode", Proceedings of 2004 International Symposium on Power Semiconductor Devices & ICs, Kitakyushu, pp. 397-400.

* cited by examiner

*Primary Examiner* — Cuong Q Nguyen
*Assistant Examiner* — Galina Yushina
(74) *Attorney, Agent, or Firm* — Murphy, Bilak & Homiller, PLLC

(57) ABSTRACT

A semiconductor arrangement includes a MOSFET having a source region, a drift region and a drain region of a first conductivity type, a body region of a second conductivity type arranged between the source region and the drift region, a gate electrode arranged adjacent the body region and dielectrically insulated from the body region by a gate dielectric, and a source electrode contacting the source region and the body region. The semiconductor arrangement further includes a normally-off JFET having a channel region of the first conductivity type that is coupled between the source electrode and the drift region and extends adjacent the body region so that a p-n junction is formed between the body region and the channel region.

27 Claims, 4 Drawing Sheets

TRANSISTOR ARRANGEMENT WITH A MOSFET

TECHNICAL FIELD

Embodiments of the present invention relate to a transistor arrangement with a MOSFET, and more particularly to a semiconductor arrangement with a MOSFET and a normally-off JFET.

BACKGROUND

MOSFETs (Metal Oxide Semiconductor Field-Effect Transistors), in particular power MOSFETs, are widely used as electronic switches for switching electrical loads or as electronic switches in all types of switching converters. A power MOSFET includes a drain region, a drift region adjoining the drain region, and a source region, each having a first conductivity type, and a body region arranged between the drift region and source region of a second conductivity type. A gate electrode serves to control a conducting channel in the body region between the source region and the drift region. The source region is electrically connected to a source electrode which is also connected to the body region, and the drain region is electrically connected to a drain electrode.

A MOSFET can be operated in forward biased state and in a reverse-biased state. In the forward biased state, a voltage between the drain and the source electrode is such that a P-N junction between the body region and the drift region is reverse biased. In the forward biased state the MOSFET can be switched on and off by applying a suitable electrical potential at the gate electrode. In the reverse biased state of the MOSFET the p-n junction between the body region and the source region is forward biased, so that the MOSFET in the reverse biased state acts like a diode, commonly known as a body diode.

In many applications, such as applications in which a MOSFET is used as a switch that cyclically switches an inductive load, there are time periods in which the MOSFET is reverse biased so that the body diode conducts a current. The losses that occur when a current flows through the MOSFET in its reverse direction are dependent on the current and the forward voltage of the body diode. The forward voltage of the body diode is the voltage that is required to bias the body diode such that it conducts a current. In a silicon MOSFET the forward voltage is about 0.7V.

There is a need to provide a MOSFET that has reduced losses when it is operated to conduct a current in its reverse direction.

SUMMARY

A first embodiment relates to a MOSFET arrangement, including a MOSFET with a source region, a drift region and a drain region of a first conductivity type, a body region arranged between the source region and the drift region of a second conductivity type, and a gate electrode arranged adjacent the body region and dielectrically insulated from the body region by a gate dielectric. A source electrode contacts the source region and the body region. The MOSFET arrangement further includes a normally-off JFET having a channel region of the first conductivity type extending from the source electrode to the drift region adjacent the body region, so that a P-N junction is formed between the body region and the channel region.

A second embodiment relates to a MOSFET, including a semiconductor body with source region, a drift region and a drain region of a first conductivity type, and a body region arranged between the source region and the drift region of a second conductivity type. The MOSFET further includes a gate electrode arranged adjacent the body region and dielectrically insulated from the body region by a gate dielectric, and a source electrode contacting the source region and the body region. A channel region of the first conductivity type extends from the source electrode to the drift region adjacent the body region, so that a P-N junction is formed between the body region and the channel region. A doping concentration of the body region and a width of the channel region is such that a intrinsic depletion zone pinches off the channel region when the MOSFET is in an unbiased state.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
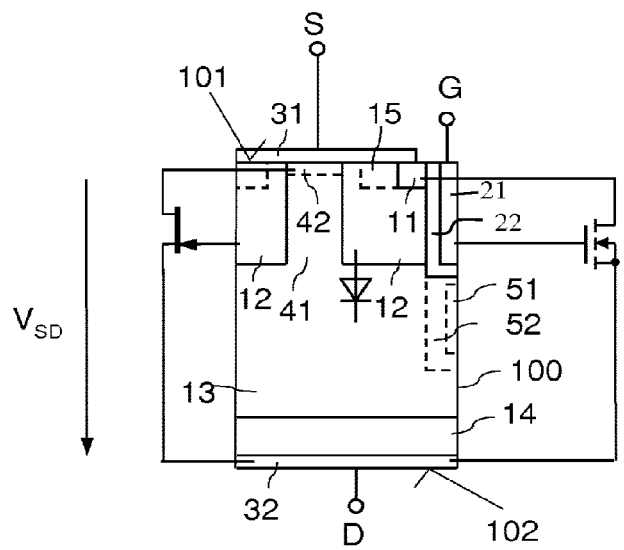
FIG. 1 illustrates a schematic vertical cross sectional view of a semiconductor arrangement with a MOSFET and a normally-off JFET according to a first embodiment.

FIG. 1 schematically illustrates a semiconductor arrangement with a MOSFET and a normally-off JFET. Specifically, FIG. 1 illustrates a vertical cross sectional view of a semiconductor body 100 in which active regions of a MOSFET and of a normally-off JFET are implemented. The semiconductor arrangement includes the semiconductor body 100 with a first surface 101 and a second surface 102 opposite the first surface 101. The semiconductor body 100 can include a conventional semiconductor material, such as silicon (Si), etc. FIG. 1 illustrates a vertical cross section through the semiconductor body 100, which is a cross section in a vertical section plane that extends perpendicular to the first and second surfaces 101, 102.

The MOSFET includes a source region 11, a drift region 13 and a drain region 14, each of a first conductivity type, and a body region 12 of a second conductivity type that is complementary to the first conductivity type. The body region 12 is arranged between the source region 11 and the drift region 13, so that the body region 12 separates the source region 11 from the drift region 13. The drift region 13 is arranged between the body region 12 and the drain region 14, with a p-n junction formed between the body region 12 and the drift region 13.

The MOSFET further includes a gate electrode 21 that is arranged adjacent to the body region 12 and extends from the source region 11 to the drift region 13. The gate electrode 21 is dielectrically insulated from the source region 11, the body region 12 and the drift region 13 by a gate dielectric 22. In a conventional manner, the gate electrode 21 serves to control a conducting channel in the body region 12 between the source region 11 and the drift region 13.

The MOSFET can be implemented as an n-type MOSFET or as a p-type MOSFET. In an n-type MOSFET the source region 11, the drift region 13 and the drain region 14 are n-doped, while the body region 12 is p-doped. In a p-type MOSFET the source region 11, the drift region 13 and the drain region 14 are p-doped, while the body region 12 is n-doped. Doping concentrations of the source region 11 and the drain region 14 are, for example, in a range of between $10^{19}$ cm$^{-3}$ and $10^{21}$ cm$^{-3}$. The doping concentration of the drift region 13 is, for example, in a range of between $10^{13}$ cm$^{-3}$ and $2\cdot10^{17}$ cm$^{-3}$, and the doping concentration of the body region 12 is, for example, in a range of between $10^{16}$ cm$^{-3}$ and $10^{18}$ cm$^{-3}$.

The source region 11 and the body region 12 are electrically connected to a source electrode 31, and the drain region 14 is electrically connected to a drain electrode 32. The source electrode 31 and the drain electrode 32 may include a conventional electrode material, such as a highly doped polysilicon, a metal, e.g. aluminium, copper, titanium, wolfram, etc.

The MOSFET illustrated in FIG. 1 is implemented as a vertical MOSFET. In this case, the source region 11 and the drain region 14 are arranged distant to each other in the vertical direction of the semiconductor body 100. The source electrode 31 is arranged in the region of the first surface 101 of the semiconductor body 100, and the drain electrode 32 is arranged in the region of the second surface 102 of the semiconductor body 100. However, implementing the MOSFET as a vertical MOSFET is only an example. The basic principle explained herein is also applicable to a lateral MOSFET, which is a MOSFET in which the source region and the drain region are arranged distant to each other in a lateral direction of a semiconductor body.

Further, the MOSFET according to FIG. 1 is a trench MOSFET. In this MOSFET the gate electrode 21 is arranged in a trench which extends from the first surface 101 at the source region 11 through the body region 12 into the drift region 13. However, any other conventional gate configuration can be used as well, such as, for example, a gate configuration with a planar gate electrode that is arranged above the first surface 101 of the semiconductor body 100.

Optionally, the MOSFET includes a field electrode 51 that is arranged in the drift region 13 and is dielectrically insulated from the drift region 13 by a field electrode dielectric 53. Usually, the field electrode dielectric 52 is thicker than the gate dielectric 22. The field electrode dielectric 52 may include a conventional dielectric material, such as an oxide, a nitride, etc. The field electrode 51 can be arranged below the gate electrode 21 (as shown in FIG. 1). However, it is also possible to arrange the field electrode 51 in a separate trench that is distant to the trench with the gate electrode 21 in a lateral direction of the semiconductor body 100. The field electrode can be electrically connected to the gate electrode 21 or the source electrode 31.

Referring to FIG. 1, the semiconductor arrangement further includes a channel 41 of the first conductivity type. The channel 41 is electrically connected to the source electrode 31 and extends adjacent to the body region 12 from the source electrode 31 to the drift region 13, so that a p-n junction is formed between the channel 41 and the body region 12.

The channel 41 and that section of the body region 12 adjacent the channel 41 form a JFET (Junction Field-Effect Transistor). In FIG. 1, besides the active regions of the MOSFET and the JFET electric circuit symbols of these devices are also shown. For purposes of the explanation provided herein below it is assumed that the MOSFET is an n-type MOSFET and that the JFET is an n-type JFET.

The JFET is a normally-off JFET. This means that the channel 41 is pinched off by an intrinsic depletion region when the JFET is in an unbiased state, where the JFET is in an unbiased state when the MOSFET is in an unbiased state. The MOSFET is in an unbiased state when an electrical voltage between a drain terminal D connected to the drain electrode 32 and a source terminal S connected to the source electrode 31 is zero and when a voltage between a gate terminal G connected to the gate electrode 21 and the source terminal S is zero or negative. The intrinsic depletion region is the depletion region that is formed in the body region 12 and the channel region 41 along the p-n junction that is present between the body region 12 and the channel 41. At a p-n junction with a doped first region, such as the body region 12, and a doped second region, such as the channel region 41, a width w of the depletion region or a space charge region that is present in the second doped region 41 is given as (see: SZE: "Physics of Semiconductor Devices", 3rd edition, 2007, Wiley and Sons, p. 83):

$$w = \sqrt{\frac{2\varepsilon_S \psi_{bi}}{q} \frac{N_{12}}{N_{41}(N_{41} + N_{12})}}, \quad (1a)$$

Where w is the width of the depletion region, $\varepsilon_s$ is the permittivity of the semiconductor material of the doped region forming the p-n junction, $\Psi_{bi}$ is the built-in potential, q is the elementary charge, $N_{12}$ is the doping concentration of the first doped region, such as body region 12, and $N_{41}$ is the doping concentration of the second doped region, such as channel 41 in FIG. 1. The built-in potential $\Psi_{bi}$ is dependent on the type of semiconductor material and the doping concentration. At room temperature (300K) the built-in potential in silicon (Si) is between about 0.3V and 0.5V when the doping concentration is between $10^{14}$ cm$^{-3}$ and $10^{18}$ cm$^{-3}$ (see: SZE: "Semiconductor Devices, Physics and Technology", $2^{nd}$ edition, 2001, Wiley and Sons, page 92). The width of the depletion region is its width in a direction perpendicular to the p-n junction.

If the channel region 41 has a significantly lower doping concentration than the body region, than the width w of the space charge region in the channel region is approximately given as:

$$w = \sqrt{\frac{2\varepsilon_S}{q} \frac{\psi_{bi}}{N_{41}}} \quad (1b)$$

(see SZE, "Physics of Semiconductor Devices", 3rd edition, 2007, Wiley and Sons, p. 83).

The JFET has a current flow direction. The current flow direction corresponds to the direction in which the channel 41 extends from the source electrode 31 to the drift region 13. In the embodiment illustrated in FIG. 1, this current flow direction corresponds to the vertical direction of the semiconductor body 100. The body region 13 is arranged adjacent the channel region 41 in a direction perpendicular to the current flow direction. The direction perpendicular to the current flow direction is a lateral or horizontal direction of the semiconductor body 100 in the semiconductor arrangement in FIG. 1. The intrinsic depletion layer completely interrupts or pinches off the channel 41 when the intrinsic depletion layer in the direction perpendicular to the current flow direction completely extends through the channel region 41. This will be explained in more detail with reference to FIG. 2, in which the channel region 41 and adjacent regions are illustrated in greater detail.

Figure 2:
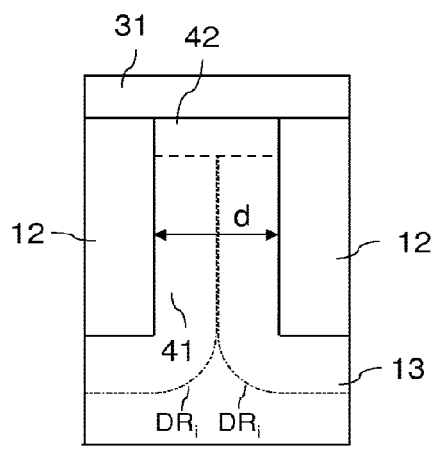
FIG. 2 illustrates a detailed schematic view of the semiconductor arrangement of FIG. 1.

Referring to FIG. 2, the channel 41 has a channel width d. The channel width d is the dimension of the channel in the direction perpendicular to the current flow direction. Specifically, the channel width d is the smallest dimension of the channel 41 in the direction perpendicular to the current flow direction. In the embodiments illustrated in FIGS. 1 and 2, the body region 12 adjoins the channel 41 on opposite sides. In this case, the intrinsic depletion region completely interrupts the channel 41, when the width of the depletion region is at least half the channel width d, i.e. when:

$$w \geq d/2 \tag{2}$$

According to one embodiment, the channel width d and the width of the intrinsic depletion region are selected such that the channel width d is between 1.5 times and less than 2 times the width w of the intrinsic depletion region, i.e. $1.5w \leq d < 2w$. The channel width d is, for example, between 0.1 μm and 0.8 μm.

In FIG. 2, $DR_I$ denotes the border of the intrinsic depletion region. In this embodiment, a width w of the intrinsic depletion region corresponds to half of the channel width d, so that the intrinsic depletion region that expands from pn-junctions on both sides of the channel 41, completely pinches of the channel 41.

Referring to FIGS. 1 and 2, a contact region 42 of the first conductivity type can be arranged between the channel region 41 and the source electrode 31 and serves to electrically connect the channel region 41 to the source electrode 31. A doping concentration of the contact region 42 is higher than the doping concentration of the channel region 41. According to one embodiment, the doping concentration of the contact region 42 is such that an ohmic contact is formed between the source electrode 31 and the contact region 42. The absolute doping concentration of the contact region 42, is for example, in the range of between $10^{19}$ cm$^{-3}$ and $10^{21}$ cm$^{-3}$. The intrinsic depletion region also expands along the pn-junction between the contact region 42 and the body region 12. However, the depletion region that expands in the contact region 42 does not extend as far into the contact region 42 as in the channel region 41 and is, therefore, not illustrated in FIG. 2.

The operating principle of the semiconductor arrangement of FIG. 1 will now be explained. For explanation purposes it is assumed that the MOSFET and the JFET are each n-type devices. However, this is only an example. The operating principle also applies to an arrangement with a p-type MOSFET and a p-type JFET, wherein in this case the polarities of the voltages that are explained in the following have to be inverted.

The functionality of the semiconductor arrangement of FIG. 1 is governed by the MOSFET. The MOSFET is in a forward-biased state when a positive voltage is applied between the drain terminal D and the source terminal S. In this forward-biased state the MOSFET can be switched on and off in a conventional manner by applying a suitable drive potential at the gate terminal G, where the MOSFET is in its on-state when the drive potential applied to the gate terminal G is suitable to generate a conducting channel (inversion channel) in the body region 12 between the source region 11 and the drift region 13. Consequently, the MOSFET is in its off-state when the drive potential applied to the gate terminal G is not sufficient to generate a conducting channel in the body region 12. In an n-type MOSFET, the drive potential that is to be applied in order to drive the MOSFET in its on-state is a positive potential as referenced to the source potential S. Typically, an n-type silicon MOSFET is in its on-state, when a gate-source voltage is above a threshold voltage at which a strong inversion in the body region along the gate dielectric sets in, and is in its off-state, when the gate-source-voltage is below this threshold.

When the MOSFET is forward-biased and in its on-state, a current flows between the source region 11 and the drain region 14 via the conductive channel in the body region 12 and the drift region 13. Specifically, n-type charge carriers (electrons) flow from the source region 11, through the conductive channel along the gate dielectric 22 and the drift region 13 to the drain region 14. In an n-type MOSFET, the drift region 13 has a higher electrical potential than the body region 12 that is connected to the source electrode 31 when the MOSFET is in its on-state. Consequently, the p-n junction between the body region 12 on the one hand and the channel 41 and the drift region 13 on the other hand is reverse biased, so that the depletion region in the region below the channel 41 extends deeper into the drift region 13. The conducting channel along the gate dielectric 22 allows a current to flow "across" this p-n junction between the body region 12 and the drift region 12, when the MOSFET is in its on-state. Since the channel 41 is already depleted by virtue of the intrinsic depletion region, there is no further expansion of the depletion region in the channel. Consequently, the channel region 41 is also pinched off or interrupted when the MOSFET is in its on-state.

When the MOSFET is forward-biased and in its off-state, the conducting channel along the gate dielectric 22 is interrupted and a depletion region expands in the drift region 13 starting at the p-n junction between the body region 12 and the drift region 13. The channel 41 of the JFET is kept interrupted in this operating state.

The doping concentration of the channel region 41 may correspond to the doping concentration of the drift region 13. In this case, the doping concentration of the channel region 41 is between $10^{13}$ cm$^{-3}$ and $2 \cdot 10^{17}$ cm$^{-3}$, in particular between $10^{13}$ cm$^{-3}$ and $10^{15}$ cm$^{-3}$, and the intrinsic depletion region at the p-n junction between the body region 12 and the channel region 41 is the same as an intrinsic depletion region along the p-n-junction between the body region 12 and the drift region 13. However, it is also possible to provide a doping concentration of the channel 41 that is different from the doping concentration of the drift region 12. The doping concentration of the channel region 41 can be higher or lower than the doping concentration of the drift region 12. However, in each case the doping concentration of the channel region 41 and of the body region 12 are adapted to each other and the channel width d such that the intrinsic depletion region pinches off the channel 41.

The (n-type) MOSFET is reverse-biased, when a positive voltage is applied between the source terminal S and the drain terminal D, which is when the source terminal S has a positive potential as referenced to the drain terminal. In this reverse-biased state a body diode of the MOSFET is connected in parallel with the JFET. The body diode is formed by the body region 12 and the drift region 13. The electric circuit symbol of the body diode is also shown in FIG. 1. A current may flow through the body diode, when a voltage between the source terminal S and the drain terminal D is higher than a forward-voltage of the body diode, which means when a voltage between the source terminal S and the drain terminal D biases the p-n junction between the body region 12 and the drift region 13 in its forward direction. This forward-biasing voltage is typically about 0.7V in a silicon diode.

In the MOSFET according to FIG. 1, however, a current may already flow between the source terminal S and the drain terminal D through the JFET when a voltage $V_{SD}$ between the source terminal S and the drain terminal D is below the forward-biasing voltage of the body diode, for the following reason. If the MOSFET is in an unbiased state, the intrinsic depletion region pinches off the channel region 41 of the JFET. If a positive voltage is applied between the body region 12 and the channel region 41, which is the case when the MOSFET is reverse biased, the depletion region or space charge region along the p-n junction between the body region 12 and the channel region 41 reduces its width, so that the n-type channel region 41 between the source electrode 31 and the drift region 13 is opened. The voltage that is required to open the channel region 41 is higher than a pinch-off voltage of the JFET and is dependent on how much the intrinsic depletion regions expanding from the p-n-junctions on both sides of the channel region 41 overlap each other. When these intrinsic depletion regions are such that a width w of the intrinsic depletion region is between 0.5·d and 0.6·d, the pinch-off voltage is a positive voltage that is significantly below the forward-biasing voltage. Thus, positive voltages that are below the forward-biasing voltage are sufficient in order to open the channel.

Thus, the JFET having its channel region adjacent to the body region 12 and being controlled by the body region 12 or the source electrode 31, respectively, helps to reduce the reverse voltage that is required in order to have the MOSFET conduct a current in its reverse direction. Further, the reverse-recovery behavior of the MOSFET is improved, for the following reason. Unlike the body diode, the JFET is a unipolar device, so that mainly majority charge carriers flow through the drift region 13 when the MOSFET is reverse biased and when the reverse voltage is below the forward voltage of the body diode. Thus, there are no or only a few minority charge carriers in the drift region 13. In conventional MOSFETs in which the body diode becomes active when the MOSFET is reverse biased, these minority charge carriers must be removed from the drift region before the MOSFET blocks when a forward biasing voltage is applied. This removal of minority charge carriers causes a delay time which may result in increased losses. This is largely prevented in the arrangements explained herein.

Figure 3:
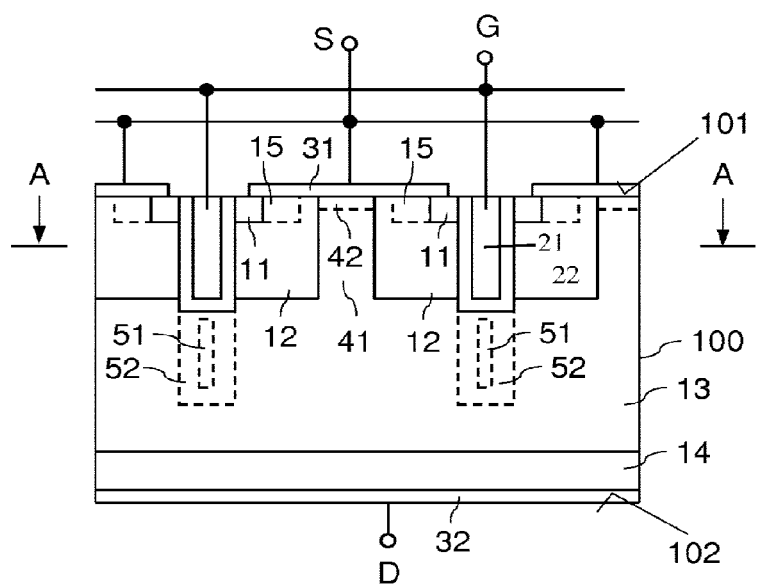
FIG. 3 illustrates a schematic vertical cross sectional view of a semiconductor arrangement with a MOSFET and a normally-off JFET, each having a cell-like structure according to a first embodiment.

Referring to FIG. 3, the MOSFET can be implemented with a plurality of identical transistor cells that are connected in parallel. Each of these transistor cells includes a source region 11, a body region 12, a gate electrode 21 and a gate dielectric 22, as well as an optional field electrode 51 and a field electrode dielectric 52. The drift region 13 and the drain region 14 are common to the individual transistor cells. The source regions 11 and the body regions 12 are connected to a common source electrode 31 or source terminal S respectively, and the individual gate electrodes 21 are connected to a common gate terminal G. In this embodiment, the channel region 41 and the optional contact region 42 of one JFET is arranged between the body regions 12 of two neighboring transistor cells. That which has been explained previously herein concerning the operating principle of the MOSFET of FIG. 1 applies to the MOSFET of FIG. 3 accordingly.

The individual transistor cells may have one of a plurality of known shapes or geometries. The shape or geometry of a transistor cell is mainly defined by the shape of the corresponding source or body region. Different embodiments are explained next with reference to FIGS. 4 to 7. FIGS. 4 to 7 each show a horizontal cross sectional view (in a section plane A-A) of a semiconductor body 100 in which transistor cells of a MOSFET and channel regions of JFETs are arranged.

Figure 4:
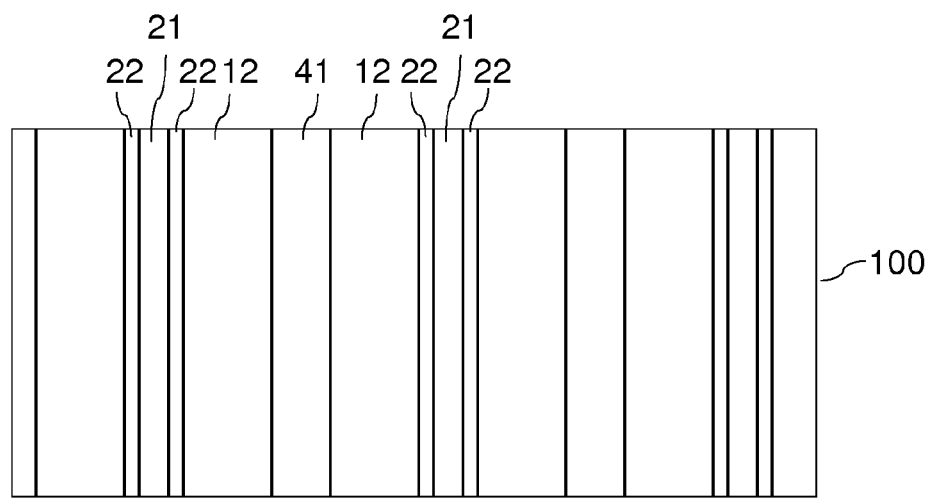
FIG. 4 illustrates a schematic horizontal cross sectional view of a semiconductor arrangement in which the MOSFET includes a plurality of cells with a stripe shape.

FIG. 4 shows an embodiment in which the individual transistor cells have a stripe shape. In this embodiment, the source regions 11, the body regions 12, and the gate electrodes 21 have a stripe-shaped or longitudinal geometry. Consequently, the channel regions 41 arranged between two neighboring body regions 12 also have a longitudinal or stripe-shaped geometry.

Figure 5:
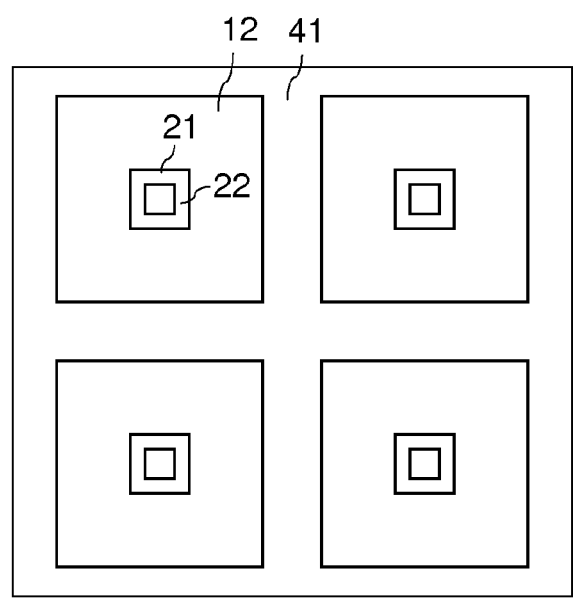
FIG. 5 illustrates a schematic horizontal cross sectional view of a semiconductor arrangement in which the MOSFET includes a plurality of cells with a rectangular shape.

In the embodiment illustrated in FIG. 5, the source regions and the body regions have a rectangular geometry. In this case, there is only one channel region 41 of the JFET, where individual sections of this channel region 41 are arranged between two body regions 12 of two neighboring transistor cells. In the horizontal plain the channel region 41 has the shape of a rectangular grid.

Figure 6:
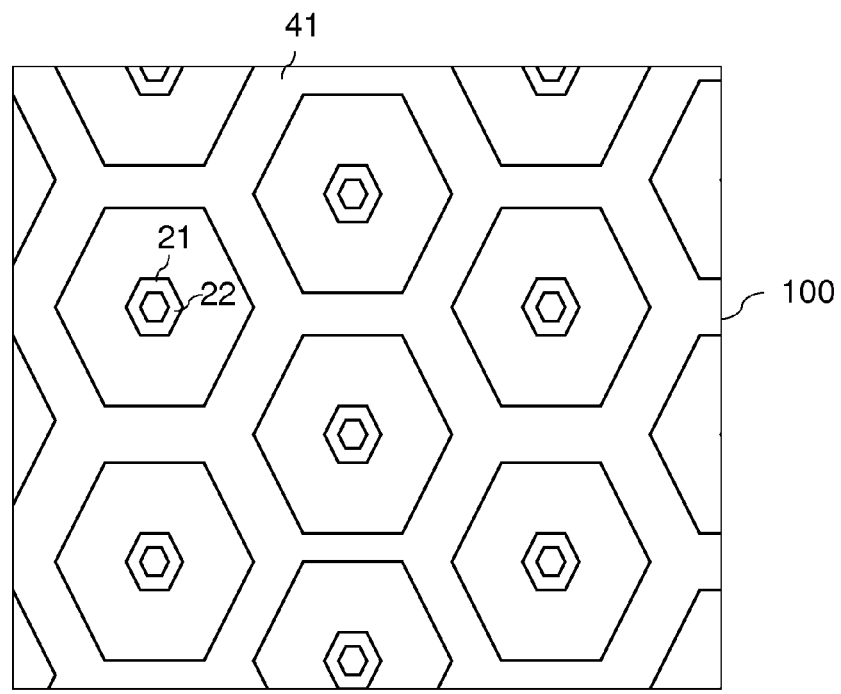
FIG. 6 illustrates a schematic horizontal cross sectional view of a semiconductor arrangement in which the MOSFET includes a plurality of cells with a hexagonal shape.

In the embodiment illustrated in FIG. 6, the source regions and the body regions have a hexagonal geometry. In this case, there is only one channel region 41 of the JFET, where individual sections of the channel region 41 are arranged between two body regions 12 of two neighboring transistor cells. In the horizontal plain the channel region 41 has the shape of a hexagonal grid.

Figure 7:
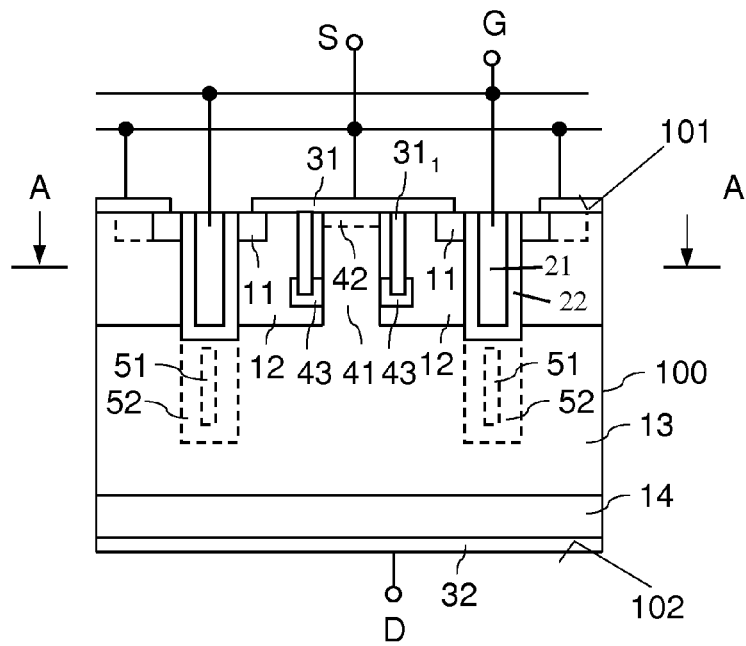
FIG. 7 illustrates a schematic vertical cross sectional view of a semiconductor arrangement with a MOSFET and a normally-off JFET according to a second embodiment.

FIG. 7 shows a vertical cross sectional view of a semiconductor arrangement with a MOSFET and a JFET. The arrangement illustrated in FIG. 7 is based on the arrangement illustrated in FIGS. 1 and 3. Compared with the arrangement according to FIGS. 1 and 3, the arrangement of FIG. 7 additionally includes a channel control region 43 of the second conductivity type. The channel control region 43 is arranged in the body region 12 but is more highly doped than the body region 12. A doping concentration of the channel control region 43 is, for example, between 5 times and 50 times the doping concentration of the body region 12. The channel control region 43 forms a p-n junction with the channel region 41 and is arranged distant to the optional contact region 42 in the current flow direction. The channel control region 43 is electrically connected to the source electrode 31, where the source electrode 31 includes an electrode section $31_1$ which extends into the semiconductor body 100 and to the channel control region 43. In the embodiment illustrated in FIG. 7, the channel control region 43 is arranged distant to the first surface 101 of the semiconductor body 100. The distance is, for example, between 0.1 μm and 3 μm.

In the device of FIG. 7, the doping concentration of the channel control region 43, together with the doping concentration of the channel region 41, defines the pinch-off voltage of the JFET. The doping concentration of the body region 12 defines the threshold voltage of the MOSFET. The doping concentrations of the channel control region 43 and of the body region 12 can be selected independently, so that the pinch-of voltage and/or the channel width of the JFET can be adjusted independently of a doping concentration of the body region 12 and, therefore, independently of the threshold voltage of the MOSFET.

Figure 8:
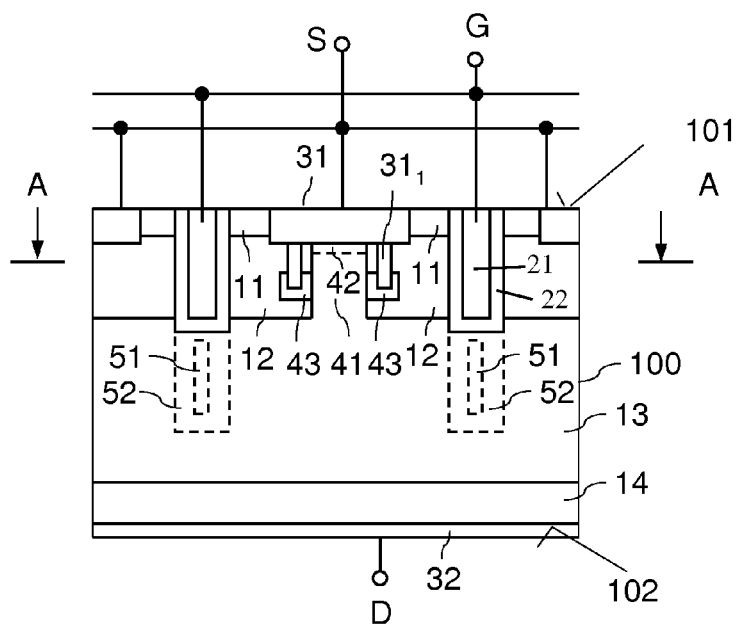
FIG. 8 illustrates a modification of the semiconductor component of FIG. 7.

FIG. 8 illustrates a modification of the arrangement of FIG. 7. In the arrangement of FIG. 8, the channel region 41 or the optional contact region 42 does not extend to the first surface 101 of the semiconductor body 100. In this embodiment, the semiconductor body 100 includes a trench in the first surface 101 in which the source electrode 31 is at least partially arranged. The source electrode 31 contacts the channel region 41 or the optional contact region 42 at the bottom of the trench and the source region 11 along sidewalls of the trench.

Figure 9:
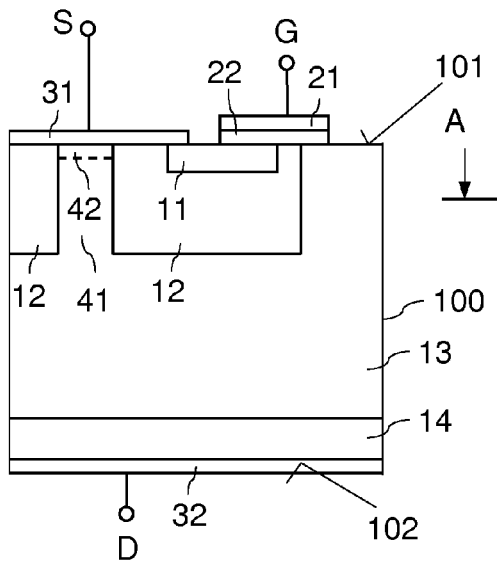
FIG. 9 illustrates a schematic vertical cross sectional view of a semiconductor arrangement with a MOSFET and a normally-off JFET according to a third embodiment.

Referring to what has been explained herein before, the basic principle of providing a normally-off JFET in parallel with a MOSFET is not restricted to a trench MOSFET. FIG. 9 illustrates a vertical cross sectional view of a semiconductor arrangement with a MOSFET that has a planar gate electrode 21, i.e. a gate electrode 21 arranged above the first surface 101 of the semiconductor body 100. In this embodiment, the drift region 13 extends to the first surface 101 of the semiconductor body along a first side of the body region 12, where the channel region 41 and the optional contact region 42 extend from the drift region 13 to the source electrode 31 along a second side, which is opposite the first side of the body region 12.

In the embodiments described previously herein, the channel region 41 forms two p-n junctions with the body region 12, where depletion regions may expand from these p-n junctions that are arranged on opposing sides of the channel region 41. However, this is only an example.

Figure 10:
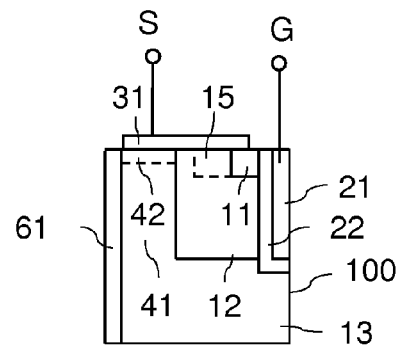
FIG. 10 illustrates a schematic vertical cross sectional view of a semiconductor arrangement with a MOSFET and a normally-off JFET according to a further embodiment.

FIG. 10 illustrates an embodiment, in which the channel region 41 adjoins the body region 12 on one side and adjoins an insulation layer 61, such as an oxide layer on the other side. In this embodiment there is only one p-n junction between the channel region 41 and the body region 12. In this embodiment, a channel width d is adjusted such that it is smaller than a width w of the intrinsic depletion region, in order to interrupt or pinch off the channel region 41 when the MOSFET is unbiased.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement, comprising:
    a MOSFET comprising a source region, a drift region and a drain region of a first conductivity type, a body region of a second conductivity type arranged between the source region and the drift region, a gate electrode arranged adjacent the body region and dielectrically insulated from the body region by a gate dielectric, and a source electrode contacting the source region and the body region; and
    a normally-off JFET comprising a channel region of the first conductivity type that is coupled between the source electrode and the drift region and extends adjacent the body region so that a p-n junction is formed between the body region and the channel region.

2. The semiconductor arrangement of claim 1, wherein the body region has a basic doping with a first doping concentration and comprises a channel control region of the second conductivity type, wherein the junction control region has a higher doping concentration than the basic doping, is electrically connected to the source electrode and adjoins the channel region.

3. The semiconductor arrangement of claim 2, wherein the semiconductor body comprises a first surface, and wherein the channel control region is arranged distant to the first surface.

4. The semiconductor arrangement of claim 3, wherein a distance between the first surface and the channel control region is between 0.1 µm and 3 µm.

5. The semiconductor arrangement of claim 1, further comprising a semiconductor body in which the source region and the drain region are arranged distant to each other in a vertical direction of the semiconductor body.

6. The semiconductor arrangement of claim 5, wherein the channel region extends in a vertical direction of the semiconductor body along the body region.

7. The semiconductor arrangement of claim 1, further comprising a contact region of the first conductivity type arranged between the channel region and the source electrode and having a higher doping concentration than the channel region.

8. The semiconductor arrangement of claim 1, wherein a doping concentration of the channel region corresponds to a doping concentration of the drift region.

9. The semiconductor arrangement of claim 1, wherein the channel region adjoins the drift region.

10. The semiconductor arrangement of claim 1, wherein a doping concentration of the channel region corresponds to a doping concentration of the drift region.

11. The semiconductor arrangement of claim 1, wherein the doping concentration of the channel region is between $10^{13}$ cm$^{-3}$ and $2 \cdot 10^{17}$ cm$^{-3}$, or between $10^{13}$ cm$^{-3}$ and $10^{15}$ cm$^{-3}$.

12. The semiconductor arrangement of claim 1, wherein the JFET has a current flow direction and the channel has a width in a direction perpendicular to the current flow direction, the width being between 0.1 and 0.8 µm.

13. The semiconductor arrangement of claim 1, wherein the JFET has a current flow direction and the body region surrounds the channel region in a direction perpendicular to the current flow direction.

14. The semiconductor arrangement of claim 1, further comprising an insulation layer adjoining the channel region at a side opposite the body region.

15. The semiconductor arrangement of claim 1, wherein:
    the JFET has a current flow direction and the channel has a width in a direction perpendicular to the current flow direction;
    an intrinsic depletion region is disposed at the p-n junction between the body region and the channel region when the MOSFET is in an unbiased state;
    a width of the intrinsic depletion region is dependent on a doping concentration of the channel region; and the doping concentration of the channel region is such that the width of the depletion region is larger than the width of the channel.

16. A MOSFET, comprising:
a semiconductor body with a source region, a drift region and a drain region of a first conductivity type, and a body region of a second conductivity type arranged between the source region and the drift region;
a gate electrode arranged adjacent the body region and dielectrically insulated from the body region by a gate dielectric;
a source electrode contacting the source region and the body region; and
a channel region of the first conductivity type extending from the source electrode to the drift region adjacent to the body region, so that a p-n junction is formed between the body region and the channel region, wherein a doping concentration of the body region and a width of the channel region is such that an intrinsic depletion zone pinches off the channel region when the MOSFET is in an unbiased state.

17. The MOSFET of claim 16, wherein the body region has a basic doping with a first doping concentration and comprises a junction control region of the second conductivity type, wherein the junction control region has a higher doping concentration than the basic doping, is electrically connected to the source electrode and adjoins the channel region.

18. The MOSFET of claim 16, wherein the source region and the drain region are arranged distant to each other in a vertical direction of the semiconductor body.

19. The MOSFET of claim 16, wherein the channel region extends in a vertical direction of the semiconductor body along the body region.

20. The MOSFET of claim 16, further comprising a contact region of the first conductivity type arranged between the channel region and the source electrode and having a higher doping concentration than the channel region.

21. The MOSFET of claim 16, wherein a doping concentration of the channel region corresponds to a doping concentration of the drift region.

22. The MOSFET of claim 16, wherein the channel region adjoins the drift region.

23. The MOSFET of claim 16, wherein a doping concentration of the channel region corresponds to a doping concentration of the drift region.

24. The MOSFET of claim 16, wherein the doping concentration of the channel region is between $10^{13}$ cm$^{-3}$ and $2 \cdot 10^{17}$ cm$^{-3}$, or between $10^{13}$ cm$^{-3}$ and $10^{15}$ cm$^{-3}$.

25. The MOSFET of claim 16, wherein the channel region has a current flow direction and wherein the channel region has a width in a direction perpendicular to the current flow direction, wherein this width is between 0.1 μm and 0.8 μm.

26. The MOSFET of claim 16, wherein the body region surrounds the channel region in a direction perpendicular to a current flow direction.

27. The MOSFET of claim 16, further comprising an insulation layer adjoining the channel region at a side opposite the body region.

* * * * *